United States Patent
Liu et al.

(10) Patent No.: US 8,929,070 B2
(45) Date of Patent: Jan. 6, 2015

(54) ELECTRONIC EQUIPMENT AND EXPANSION APPARATUS THEREOF

(71) Applicants: Shih-Huei Liu, Taipei (TW); Chun-Jen Shih, Taipei (TW); Ching-Hsuan Wang, Taipei (TW); Pan-Jen Chen, Taipei (TW); Po-Han Chen, Taipei (TW)

(72) Inventors: Shih-Huei Liu, Taipei (TW); Chun-Jen Shih, Taipei (TW); Ching-Hsuan Wang, Taipei (TW); Pan-Jen Chen, Taipei (TW); Po-Han Chen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 230 days.

(21) Appl. No.: 13/721,036

(22) Filed: Dec. 20, 2012

(65) Prior Publication Data

US 2013/0155615 A1  Jun. 20, 2013

Related U.S. Application Data

(60) Provisional application No. 61/578,211, filed on Dec. 20, 2011, provisional application No. 61/650,452, filed on May 22, 2012.

(51) Int. Cl.
*H05K 7/20* (2006.01)
*G06F 1/16* (2006.01)
*G06F 1/20* (2006.01)

(52) U.S. Cl.
CPC .......... *H05K 7/20145* (2013.01); *G06F 1/1632* (2013.01); *G06F 1/203* (2013.01); *G06F 2200/202* (2013.01)
USPC ................. 361/695; 361/679.48; 361/679.49; 361/679.51; 361/679.55; 361/694; 165/80.3; 165/104.33; 165/122; 165/104.34; 454/184

(58) Field of Classification Search
USPC ............... 361/679.46–679.55, 690–697, 688, 361/689, 704–715, 679.27, 679.41, 679.09, 361/679.56; 165/80.2, 80.3, 80.4, 104.33, 165/104.34, 121–126, 185; 62/3.2, 3.3, 3.7, 62/259.2; 312/223.2; 454/184; 248/279.1, 248/442.2, 122.1, 346.1, 346, 510, 289.1, 248/296, 278, 279, 917–923
See application file for complete search history.

(56) References Cited

U.S. PATENT DOCUMENTS 5,264,992 A  *  11/1993  Hogdahl et al. ......... 361/679.17
5,381,043 A       1/1995  Kohiyama et al.

(Continued)

FOREIGN PATENT DOCUMENTS

TW   M407415   7/2011

OTHER PUBLICATIONS

RD440179A, Dec. 2000.*

(Continued)

*Primary Examiner* — Michail V Datskovskiy
(74) *Attorney, Agent, or Firm* — Jianq Chyun IP Office

(57) ABSTRACT

An expansion apparatus suitable for an electronic apparatus is provided. The expansion apparatus includes a base, a supporter and an airflow guiding structure. The base has a first fan disposed therein. The supporter is pivoted to the base along a rotating axis and has a cooling channel. The cooling channel has a first port and a second port opposite to the first port. When the electronic apparatus is assembled to the supporter, the second port of the cooling channel faces to the electronic apparatus. The airflow guiding structure is disposed between the supporter and the base movably. When the supporter is pivoted relative to the base to an expanded state, an active airflow generated by the first fan is guided by the airflow guiding structure to pass through the base and the electronic apparatus. An electronic equipment including the expansion apparatus is also provided.

20 Claims, 13 Drawing Sheets

(56) References Cited

U.S. PATENT DOCUMENTS

| | | | |
|---|---|---|---|
| 6,282,082 B1* | 8/2001 | Armitage et al. | 361/679.22 |
| 6,711,014 B2* | 3/2004 | Anzai et al. | 361/679.48 |
| 6,837,058 B1* | 1/2005 | McEuen et al. | 62/3.2 |
| 6,937,468 B2* | 8/2005 | Lin et al. | 361/679.41 |
| 7,301,767 B2* | 11/2007 | Takenoshita et al. | 361/695 |
| 8,065,887 B2* | 11/2011 | Ogorevc | 62/259.2 |
| 8,208,245 B2* | 6/2012 | Staats et al. | 361/679.02 |
| 2002/0181201 A1* | 12/2002 | Liu et al. | 361/687 |
| 2004/0261421 A1 | 12/2004 | McEuen et al. | |
| 2013/0148298 A1* | 6/2013 | Liu et al. | 361/695 |
| 2013/0148833 A1* | 6/2013 | Endo et al. | 381/332 |
| 2014/0098486 A1* | 4/2014 | Davis | 361/679.41 |

OTHER PUBLICATIONS

"Office Action of Taiwan Counterpart Application", issued on Aug. 8, 2014, p. 1-p. 4, in which the listed references were cited.

* cited by examiner

ELECTRONIC EQUIPMENT AND EXPANSION APPARATUS THEREOF

CROSS-REFERENCE TO RELATED APPLICATION

This application claims the priority benefits of U.S. provisional application Ser. No. 61/578,211, filed on Dec. 20, 2011 and U.S. provisional application Ser. No. 61/650,452, filed on May 22, 2012. The entirety of the above-mentioned patent applications is hereby incorporated by reference herein and made a part of this specification.

BACKGROUND

1. Technical Field

The invention relates to an expansion apparatus. Particularly, the invention relates to an expansion apparatus capable of guiding airflow.

2. Related Art

Along with quick development of electronic technology, various electronic products have been widely used in our work and daily life. Electronic components in the electronic product may produce heat during operations of the electronic components. In order to maintain normal operations of the electronic components, heat dissipation aperture are generally formed on a casing of the electronic product, or a fan is disposed in the electronic apparatus, such that the heat generated during operations of the electronic components can be taken away by a heat dissipation airflow through the heat dissipation aperture.

Taking a tablet personal computer (tablet PC) as an example, the tablet PC has a slim appearance and light weight, such that it is suitable for being carried around by a user, and the user can use the tablet PC to perform basic operations such as accessing Internet or transceiving emails, etc. When the tablet PC is assembled to an expansion apparatus, the tablet PC can further perform operations having higher performance requirement. However, when the tablet PC performs operations having higher performance requirement, working efficiency of electronic chips therein is also improved, and improvement of the working efficiency generally leads to a large amount of heat produced during the operations, such that the expansion apparatus has to be configured with an additional cooling system to assist cooling the tablet PC.

U.S. Pat. No. 5,381,043 discloses a power supply module and a connector, where the power supply module has a cooling channel, and a cooling airflow can flow through the cooling channel to enter an electronic apparatus to achieve a cooling effect. However, the cooling channel of the above patent is fixed, and no fan is configured in internal of the expansion apparatus. Moreover, the connector and the cooling channel of the expansion apparatus are a co-constructed structure.

U.S. Pat. No. 6,837,058 discloses a cooling base of a tablet PC, where the cooling base has a cooling channel therein. However, the cooling channel of the above patent is also fixed, and no fan is configured in internal of the cooling base. Moreover, in the above patent, the connector is not configured to the cooling base to connect the tablet PC.

SUMMARY

The invention is directed to an expansion apparatus, which is capable of guiding an airflow of a base to an electronic apparatus to assist cooling an electronic apparatus.

The invention provides an expansion apparatus, which is adapted to an electronic apparatus. The expansion apparatus includes a base, a supporter and an airflow guiding structure. The base has a first fan disposed therein. The supporter is pivoted to the base along a rotating axis and has a cooling channel. The cooling channel has a first port adjacent to the base and a second port opposite to the first port. When the electronic apparatus is assembled to the supporter, the second port of the cooling channel faces to the electronic apparatus. The airflow guiding structure is movably disposed between the supporter and the base. When the supporter is pivoted relative to the base to an expanded state, an active airflow generated by the first fan is guided by the airflow guiding structure to flow through the base and the electronic apparatus.

The invention provides an electronic equipment including an electronic apparatus and an expansion apparatus. The expansion apparatus is adapted to the electronic apparatus. The expansion apparatus includes a base, a supporter and an airflow guiding structure. The base has a first fan disposed therein. The supporter is pivoted to the base along a rotating axis and has a cooling channel. The cooling channel has a first port adjacent to the base and a second port opposite to the first port. When the electronic apparatus is assembled to the supporter, the second port of the cooling channel faces to the electronic apparatus. The airflow guiding structure is movably disposed between the supporter and the base. When the supporter is pivoted relative to the base to an expanded state, an active airflow generated by the first fan is guided by the airflow guiding structure to flow through the base and the electronic apparatus.

The invention provides an electronic apparatus, which is adapted to be disposed in an expansion apparatus having a movable airflow guiding structure. The expansion apparatus has a cooling channel, where the cooling channel has a first port and a second port opposite to the first port, and the second port of the cooling channel faces to the electronic apparatus. The electronic apparatus includes a casing and a cover element. The casing has a third port. The cover element is disposed on the casing to cover the third port. When the electronic apparatus is disposed on the expansion apparatus, the cover element is displaced due to a force, and the third port is communicated with the second port.

In an embodiment of the invention, the active airflow generated by the first fan is guided to the first port of the cooling channel by the airflow guiding structure, and is output to the electronic apparatus through the second port of the cooling channel.

In an embodiment of the invention, the electronic apparatus has a third port. When the electronic apparatus is assembled to the supporter, the third port faces to the second port, and the active airflow generated by the first fan is guided to the first port of the cooling channel by the airflow guiding structure, and is output through the second port of the cooling channel, and reaches the electronic apparatus through the third port.

In an embodiment of the invention, the electronic apparatus has a fourth port. After the active airflow generated by the first fan enters the electronic apparatus, it is exhausted to leave the electronic apparatus through the fourth port.

In an embodiment of the invention, the electronic apparatus has a third port. When the electronic apparatus is assembled to the supporter, the third port faces to the second port, and the active airflow generated by the first fan flows from the third port to the second port of the cooling channel, and then flows through the first port of the cooling channel and leaves the electronic apparatus via the airflow guiding structure.

In an embodiment of the invention, the electronic apparatus has a third port and includes a second fan. When the electronic apparatus is assembled to the supporter, the third port faces to the second port, and an active airflow generated by the second fan flows from the third port to the second port of the cooling channel, and then flows through the first port of the cooling channel and leaves the electronic apparatus via the airflow guiding structure.

In an embodiment of the invention, a relative position between the airflow guiding structure and the supporter is varied as the supporter is pivoted relative to the base.

In an embodiment of the invention, the relative position is an angle of the supporter relative to the airflow guiding structure.

In an embodiment of the invention, the airflow guiding structure includes a diversion gate, which is disposed in the cooling channel and is pivoted to the supporter. The diversion gate has a diversion channel, and when the supporter is pivoted relative to the base to the expanded state, the diversion channel corresponds to the first fan.

In an embodiment of the invention, when the supporter is pivoted relative to the base to the expanded state, the diversion gate is rotated relative to the supporter through gravity, so as to maintain the diversion channel to face to the first fan.

In an embodiment of the invention, the cooling channel has a sidewall, and the sidewall includes a curved surface, where a center of curvature of the curved surface is substantially overlapped to the rotating axis. When the supporter is pivoted relative to the base to the expanded state, the airflow guiding structure continually leans against the curved surface.

In an embodiment of the invention, the airflow guiding structure includes a plurality of diversion covers, where the diversion covers are pivoted to the base, and each of the diversion covers is capable of rotating relative to the base.

In an embodiment of the invention, when the supporter is pivoted relative to the base to the expanded state, the supporter leans against the diversion covers, and drives the diversion covers to rotate relative to the supporter, so as to narrow or cover a gap between the first port of the cooling channel and the base.

In an embodiment of the invention, the airflow guiding structure further includes a plurality of elastic members, and the elastic members are correspondingly assembled between the diversion covers and the base, where when the supporter is pivoted relative to the base to the expanded state, the elastic members correspondingly drive the diversion covers to continually lean against the supporter.

According to the above descriptions, the expansion apparatus of the invention has the first fan on the base thereof. The supporter has the cooling channel therein, and the airflow guiding structure is located in the cooling channel. The active airflow generated by the first fan is guided by the airflow guiding structure to flow through the cooling channel and is output to or exhausted from the electronic apparatus, so as to improve the cooling efficiency of the electronic apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION OF DISCLOSED EMBODIMENTS

Figure 1A:
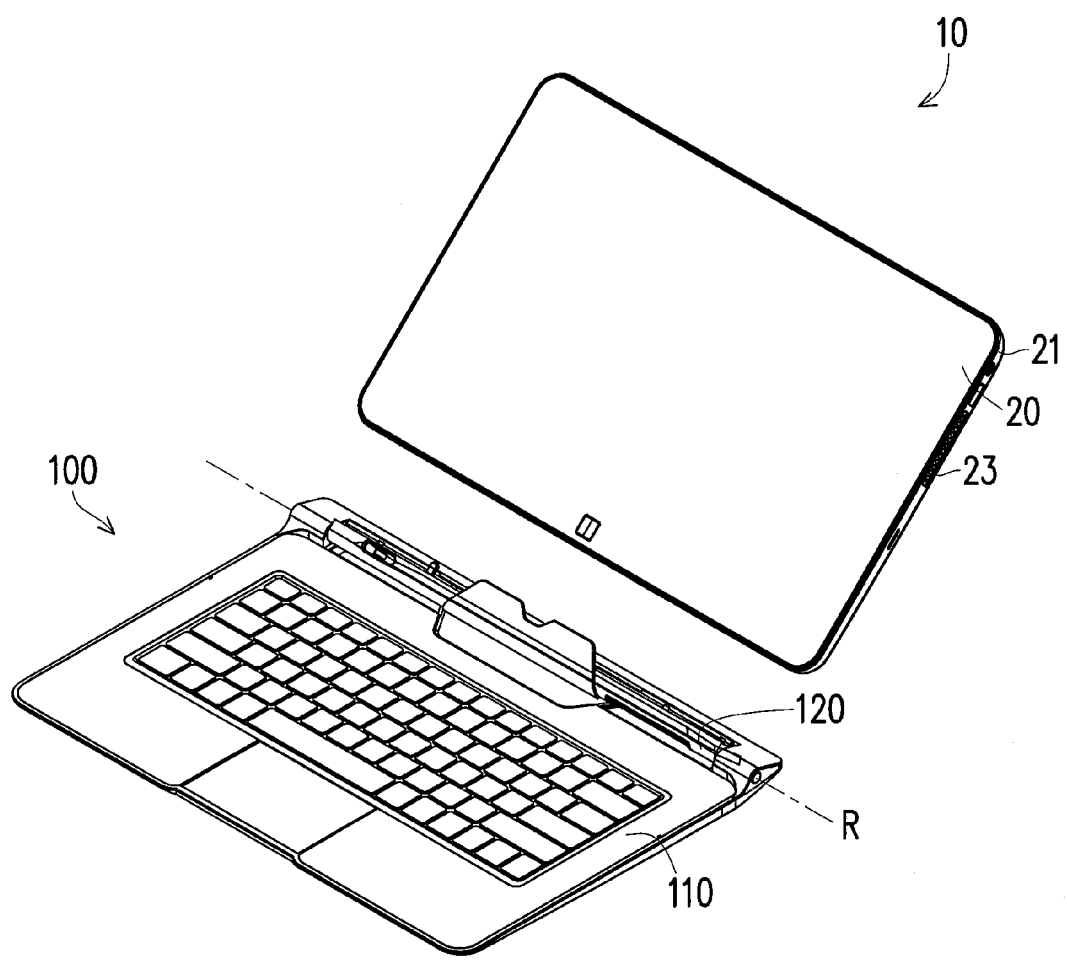
FIG. 1A is a schematic diagram of an expansion apparatus and an electronic apparatus before assembling according to an embodiment of the invention.
Figure 1B:
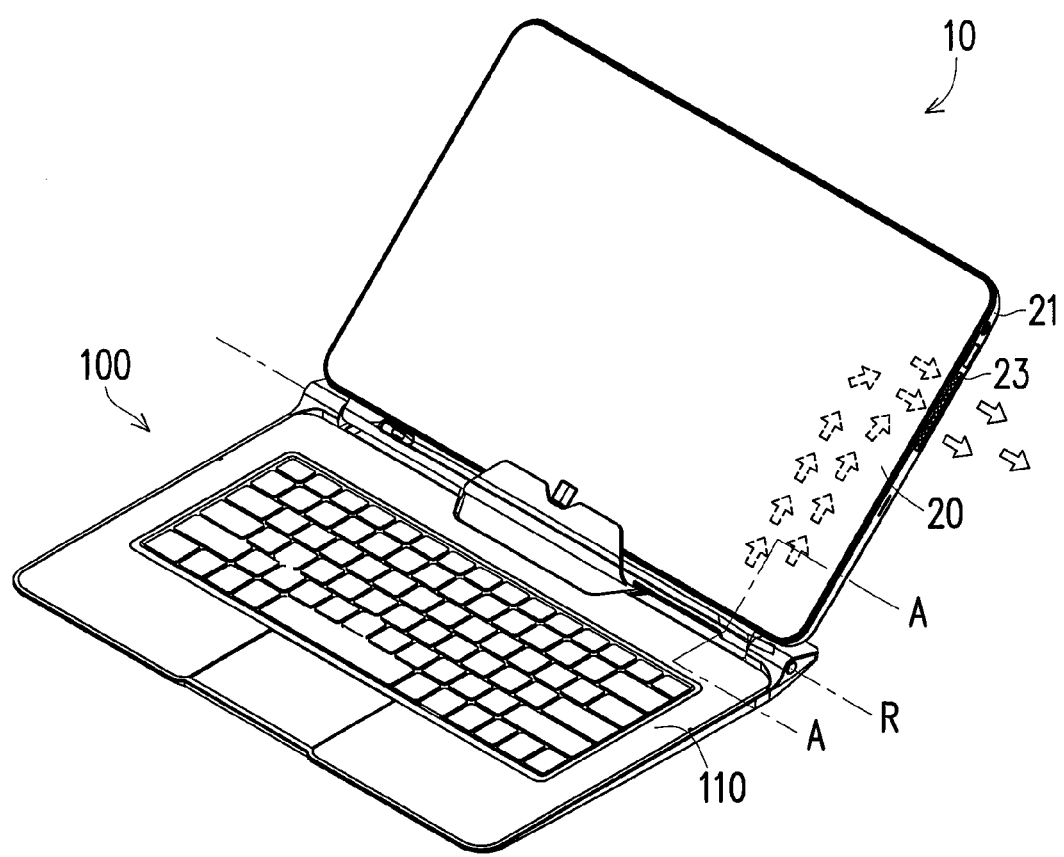
FIG. 1B is a schematic diagram of the expansion apparatus and the electronic apparatus of FIG. 1A in a combination state.
Figure 2:
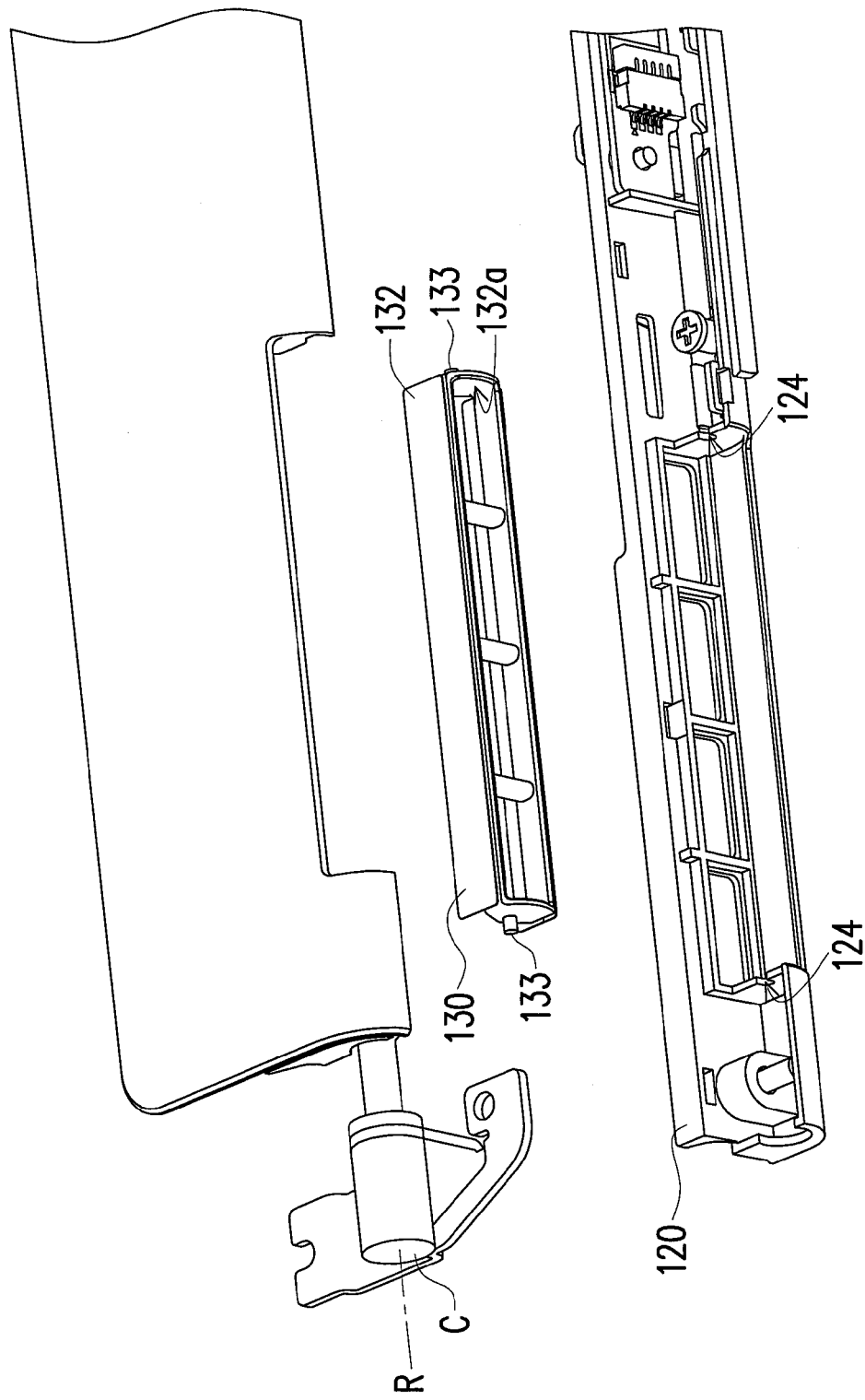
FIG. 2 is an exploded view of a part of the expansion apparatus of FIG. 1A.
Figure 3A:
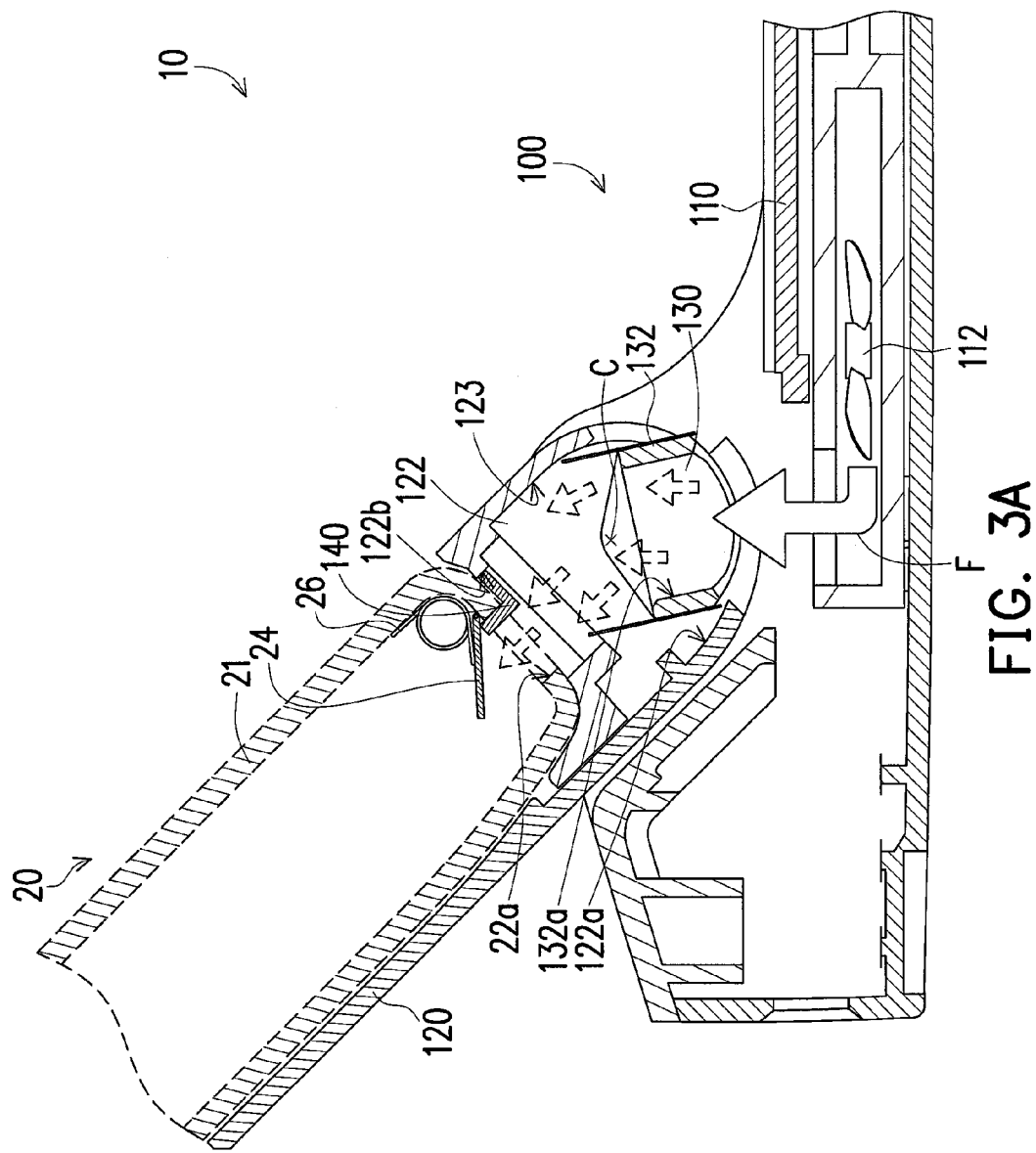
FIG. 3A is a cross-sectional view of the electronic apparatus and the expansion apparatus of FIG. 1B along a line A-A.

FIG. 1A is a schematic diagram of an expansion apparatus and an electronic apparatus before assembling according to an embodiment of the invention. FIG. 1B is a schematic diagram of the expansion apparatus and the electronic apparatus of FIG. 1A in a combination state. FIG. 2 is an exploded view of a part of the expansion apparatus of FIG. 1A. FIG. 3A is a cross-sectional view of the electronic apparatus and the expansion apparatus of FIG. 1B along a line A-A. Referring to FIG. 1A to FIG. 3A, the electronic equipment 10 of the present embodiment includes an electronic apparatus 20 and an expansion apparatus 100. The expansion apparatus 100 is adapted to the electronic apparatus 20. In the present embodiment, the electronic apparatus 20 can be a tablet PC or a flat panel display. The expansion apparatus 100 includes a base 110, a supporter 120 and an airflow guiding structure 130. The base 110 has a first fan 112 disposed therein. The supporter 120 is pivoted to the base 110 along a rotating axis R and has a cooling channel 122. The cooling channel 122 has a first port 122a adjacent to the base 110 and a second port 122b opposite to the first port 122a.

When the electronic apparatus 20 is assembled to the supporter 120 to a state as that shown in FIG. 1B, the second port 122b of the cooling channel 122 faces to the electronic apparatus 20. The airflow guiding structure 130 is movably disposed between the supporter 120 and the base 110. When the supporter 120 is pivoted relative to the base 110 to an expanded state, an active airflow F generated by the first fan 112 is guided into the first port 122a of the cooling channel 122 by the airflow guiding structure 130, and is further output to the electronic apparatus 20 through the second port 122b of the cooling channel 122.

In the present embodiment, the base 110 of the expansion apparatus 100 has the first fan 112, and the first fan 112 produces the active airflow F. However, a flowing direction of the active airflow F is not limited by the invention. The supporter 120 has the cooling channel 122 therein, and the airflow guiding structure 130 is disposed in the cooling channel 122. The airflow guiding structure 130 is a movable structure, and a relative position of the airflow guiding structure 130 in the supporter 120 is, for example, an angle of the airflow guiding structure 130 relative to the supporter 120, which is varied along with a pivoting angle of the supporter 120 relative to the base 110. When the active airflow F generated by the first fan 112 flows through the cooling channel 122, the active airflow F is guided by the airflow guiding structure 130 to flow through the cooling channel 122 and is output to the electronic apparatus 20. Therefore, the expansion apparatus 100 of the present embodiment can increase cooling efficiency of the electronic apparatus 20.

In the present embodiment, the airflow guiding structure 130 includes a diversion gate 132, which is disposed in the cooling channel 122 and is pivoted to the supporter 120. The diversion gate 132 has at least one diversion channel 132a, and when the supporter 120 is pivoted relative to the base 110 to the expanded state, the diversion channel 132a corresponds to the first fan 112. In detail, in FIG. 2, two sides of the diversion gate 132 respectively have a rotation shaft 133, and the supporter 120 correspondingly has two assembly slots 124. The rotation shafts 133 are correspondingly assembled in the assembly slots 124, and the diversion gate 132 can rotate relative to the supporter 120.

Moreover, when the supporter 120 is pivoted relative to the base 110 to the expanded state, the diversion gate 132 can be rotated relative to the supporter 120 through gravity, so as to maintain the diversion channel 132a to face to the first fan 112. In detail, in the present embodiment, the diversion gate 132 is pivoted to the supporter 120 only through the rotation shafts 133 without using other fixing members. When the supporter 120 is expanded relative to the base 110, the diversion gate 132 rotates within the cooling channel 122 relative to the supporter 120, and continually faces to the first fan 112 through gravity.

Moreover, the electronic apparatus 20 includes a casing 21 and a cover element 24. The casing 21 has a third port 22a. The cover element 24 is disposed on the casing 21 to cover the third port 22a. When the electronic apparatus 20 is disposed on the expansion apparatus 100, and the supporter 120 is expanded relative to the base 110, the cover element 24 is displaced due to a force, and the third port 22a is communicated with the second port 122b. In other words, when the electronic apparatus 20 is assembled to the supporter 120, and the supporter 120 is expanded relative to the base 110, the cover element 24 is displaced due to a force to expose the third port 22a, such that the active airflow F generated by the first fan 112 can be guided into the first port 122a of the cooling channel 122 by the airflow guiding structure 130, and is further output through the second port 122b of the cooling channel 122, and reaches the electronic apparatus 20 through the third port 22a. Moreover, in the present embodiment, the electronic apparatus 100 further has a fourth port 23. After the active airflow F generated by the first fan 112 enters the electronic apparatus 20, the active airflow F carries the heat generated in internal of the electronic apparatus 20, and is exhausted to leave the electronic apparatus 20 through the fourth port 23.

Figure 3B:
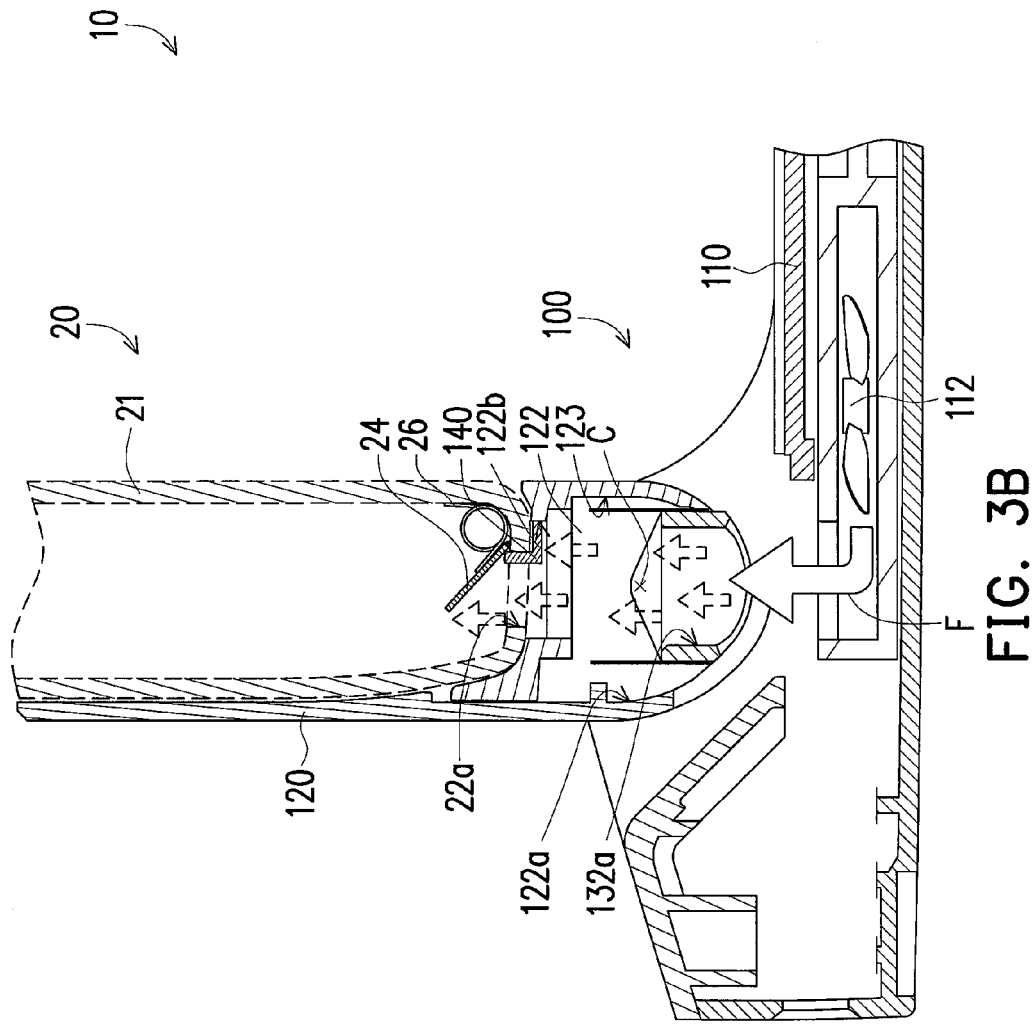
FIG. 3B and FIG. 3C are respectively schematic diagrams of a supporter expanded relative to a base in another angle and closed to the base.
Figure 3C:
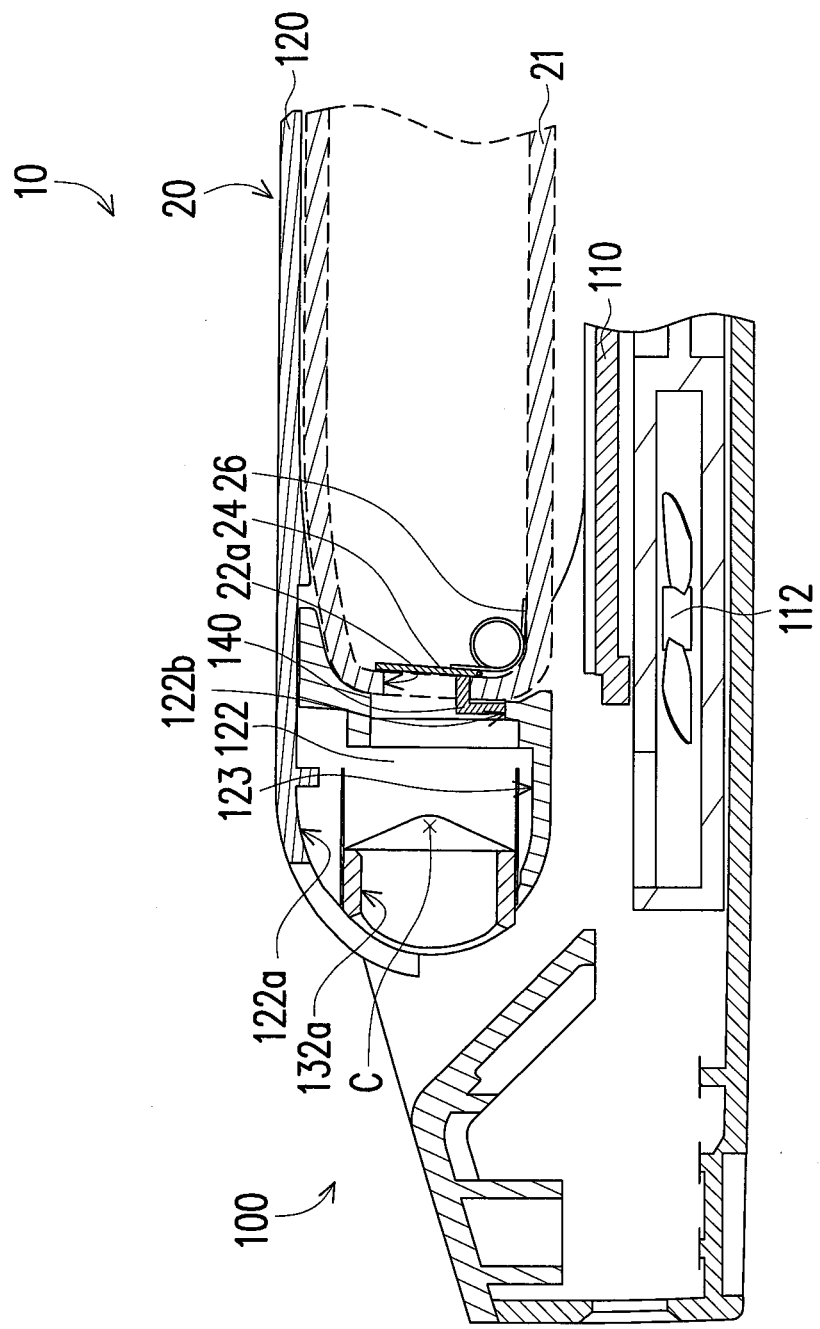

FIG. 3B and FIG. 3C are respectively schematic diagrams of the supporter expanded relative to the base in another angle and closed to the base. Referring to FIG. 3A and FIG. 3C, in the present embodiment, a relative position between the airflow guiding structure 130 and the supporter 120 is varied as the supporter 120 is pivoted relative to the base 110. First, when the electronic apparatus 20 is assembled to the expansion apparatus 100 and is closed to a state as that shown in FIG. 3C, the supporter 120 and the diversion gate 132 are all closed to the base 110, and the airflow guiding structure 130 does not face to the first fan 112. When the electronic apparatus 20 and the supporter 120 are expanded relative to the base 110 in 135 degrees and 90 degrees (as that shown in FIG. 3A and FIG. 3B), the supporter 120 is expanded relative to the base 110, and the diversion gate 132 located in the cooling channel 122 and pivoted to the supporter 120 can rotate relative to the supporter 120 along the rotation shaft 133 within the cooling channel 122, such that the diversion gate 132 continually faces to the first fan 112.

It should be noticed that in the present embodiment, the diversion gate 132 can be a movable structure, and a relative position between the airflow guiding structure 130 and the supporter 120 is, for example, an angle of the supporter 120 relative to the airflow guiding structure 130. Therefore, when the supporter 120 is expanded to any angle relative to the base 110, the diversion gate 132 can rotate relative to the supporter 120 along the rotation shaft 133 along with the expanding angle of the supporter 120, so as to continually face to the first fan 112. In the invention, although two expanding angles of FIG. 3A and FIG. 3B are taken as examples for description, the expanding angle of the supporter 120 relative to the base 110 is not limited by the invention.

In the present embodiment, the expanded state refers to that the supporter 120 is expanded relative to the base 110, and an included angle between the supporter 120 and the base 110 is between 90 degrees and 135 degrees. However, the invention is not limited thereto. The cooling channel 122 of the supporter 120 has at least one sidewall 123, and the sidewall 123 includes a curved surface, where a center of curvature C of the curved surface is substantially overlapped to the rotating axis R (shown in FIG. 2). In other words, in the cooling channel 122, a distance between any point on the curved surface and the rotating axis R is substantially the same. When the supporter 120 is pivoted relative to the base 110 to the expanded state, the airflow guiding structure 130 continually leans against the curved surface. Therefore, in FIG. 3A and FIG. 3B, the diversion gate 132 can continually contact the sidewall 123 of the cooling channel 122 to avoid the active airflow generated by the first fan 112 from leaking through a gap between the diversion gate 132 and the cooling channel 122.

Moreover, when the supporter 120 is expanded relative to the base 110, the cover element 24 of the electronic apparatus 20 is displaced due to the force. The cover element 24 is, for example, pushed by a pushing structure 140 of the expansion apparatus 100. In detail, when the supporter 120 is in a closing state as that shown in FIG. 3C, the cover element 24 covers the third port 22a. During a process that the supporter 120 is expanded relative to the base 110 to a state shown in FIG. 3A or FIG. 3B, the pushing structure 140 continually pushes the cover element 24, such that the cover element 24 no longer covers the third port 22a. Moreover, the cover element 24 is, for example, pivoted in the casing 21 of the electronic equipment 10, and an elastic member 26 is configured between the cover element 24 and the casing 21 to serve as an energy source for restoring the cover element 24. When the supporter 120 is closed to the base 110 or the electronic apparatus 20 is taken away from the expansion apparatus 100, the elastic member 26 can drive the cover element 24 to restore its displacement to avoid exposing the third port 22a, so as to prevent dust from entering the electronic apparatus 20. However, a connection relationship between the cover element 24 and the casing 21 is not limited by the invention, and further configuration of the elastic member 26 between the cover element 24 and the casing 21 is also not limited by the invention.

Figure 4A:
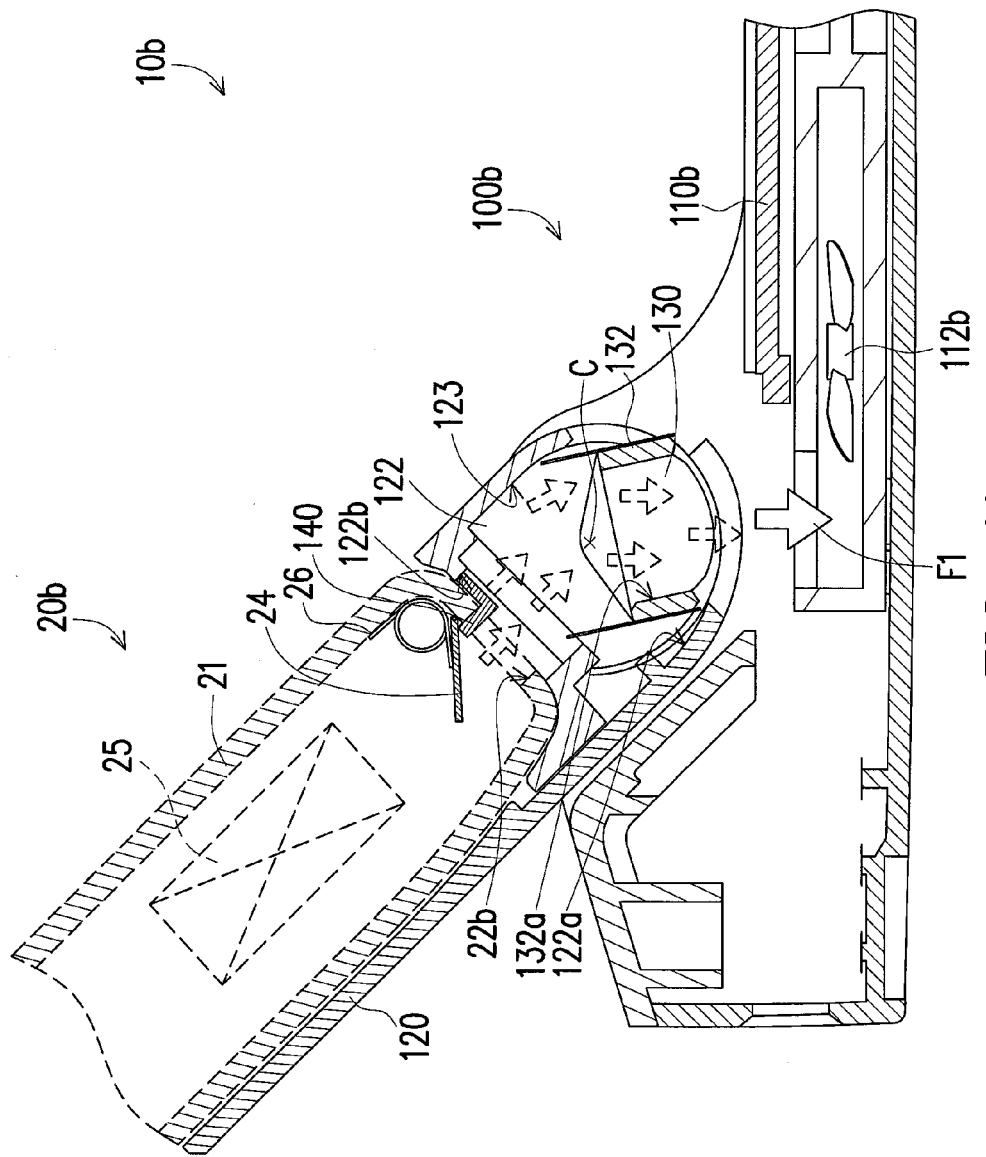
FIG. 4A is a cross-sectional view of an electronic apparatus and an expansion apparatus according to another embodiment of the invention.
Figure 4B:
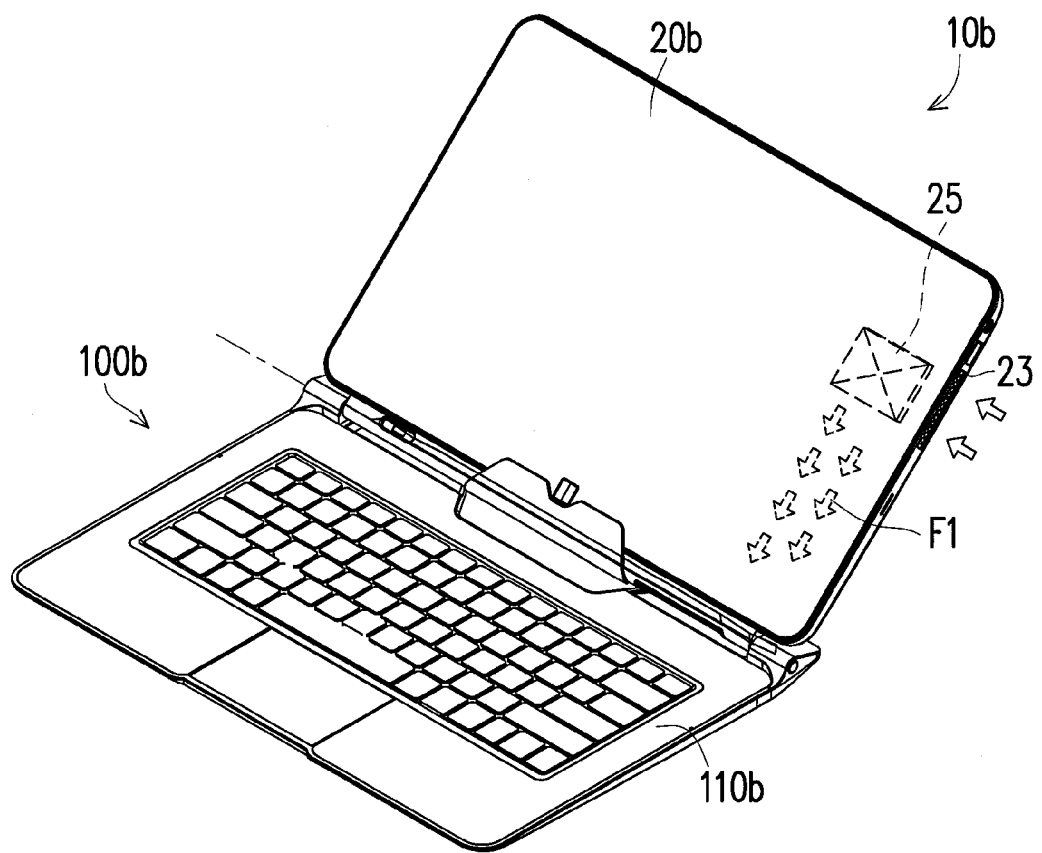
FIG. 4B is a schematic diagram of the electronic apparatus and the expansion apparatus of FIG. 4A in a combination state.

FIG. 4A is a cross-sectional view of an electronic apparatus and an expansion apparatus according to another embodiment of the invention. FIG. 4B is a schematic diagram of the electronic apparatus and the expansion apparatus of FIG. 4A in a combination state. In FIG. 4A, an angle that the expansion apparatus 100b is expanded relative to a base 110b is the same as that of FIG. 3A, and the electronic apparatus 20b has a third port 22b. A difference between the embodiments of FIG. 4A and FIG. 3A is that in the electronic equipment 10b, when the electronic apparatus 20b is assembled to the supporter 120, the third port 22b faces to the second port 122b, and an active airflow F1 generated by a first fan 112b of a base 110b flows from the third port 22b to the second port 122b of the cooling channel 122, and then flows through the first port 122a of the cooling channel 122 and leaves the electronic apparatus 20b via the airflow guiding structure 130. A flowing direction of the active airflow F1 is reversed to that of the active airflow F of FIG. 3A, and other structure designs are all the same. Therefore, in the present embodiment, the first fan 112 can be regarded as exhaust ventilation equipment, which is used to exhaust the heat generated by the electronic apparatus 20b. Moreover, the electronic apparatus 20b further includes a second fan 25. The second fan 25 can generate the active airflow F1 to flow from the third port 22b to the second port 122b of the cooling channel 122, and then flows through the first port 122a of the cooling channel 122 and leaves the electronic apparatus 20b via the airflow guiding structure 130. The invention is not limited to a situation that the expansion apparatus 100b and the electronic apparatus 20b of the electronic equipment 10b respectively include the first fan 112b and the second fan 25. In other embodiments of the invention that are not illustrated, the first fan can be configured in the expansion apparatus of the electronic equipment, and the first fan can generate the active airflow having a flowing direction the same as that shown in FIG. 4A. Moreover, in another embodiment of the invention that is not illustrated, the second fan can be configured in the electronic apparatus of the electronic equipment, and no fan is configured in the expansion apparatus, and the second fan can generate the active airflow having a flowing direction the same as that shown in FIG. 4A.

Figure 5A:
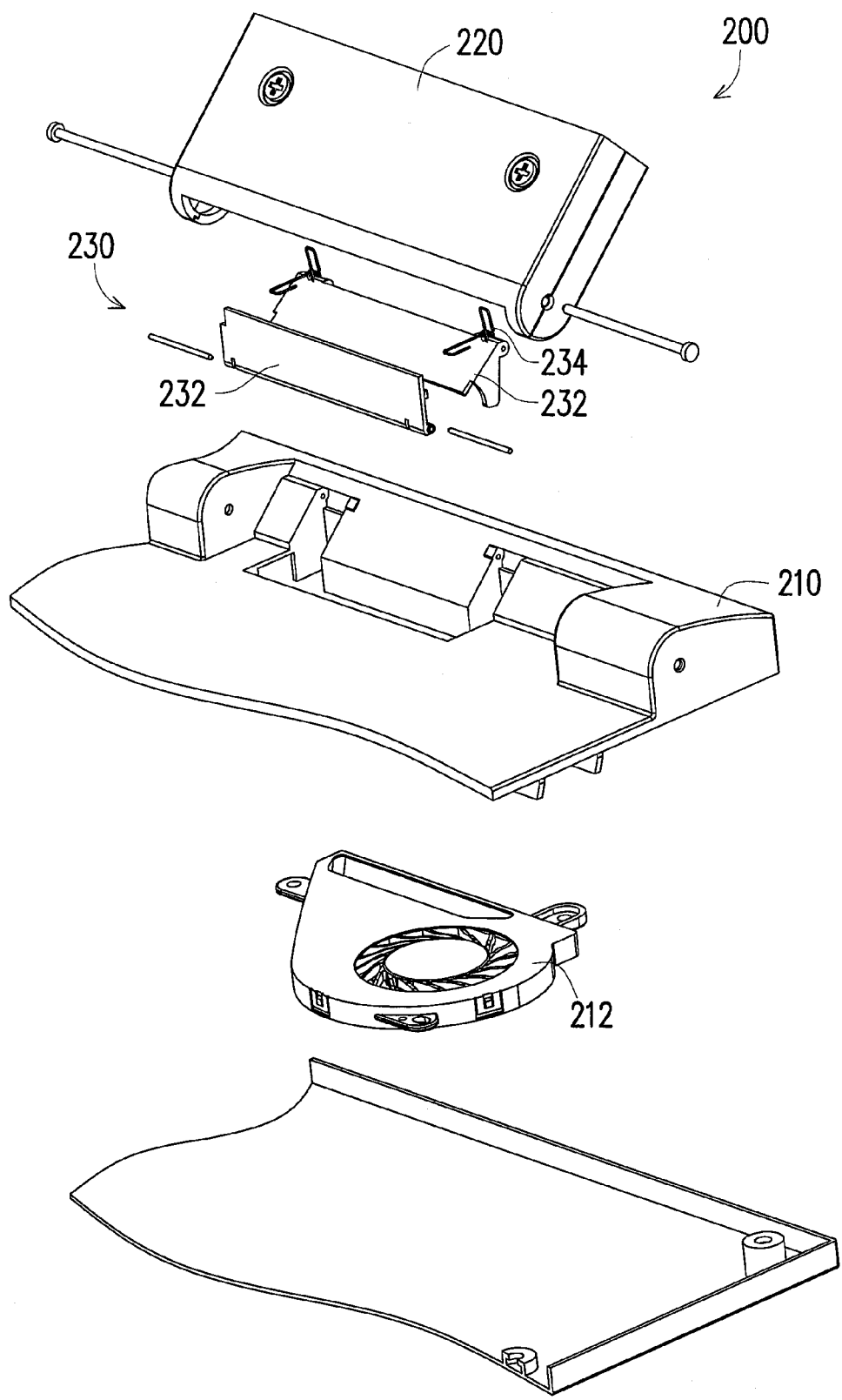
FIG. 5A is an exploded view of a part of an expansion apparatus according to another embodiment of the invention.
Figure 5B:
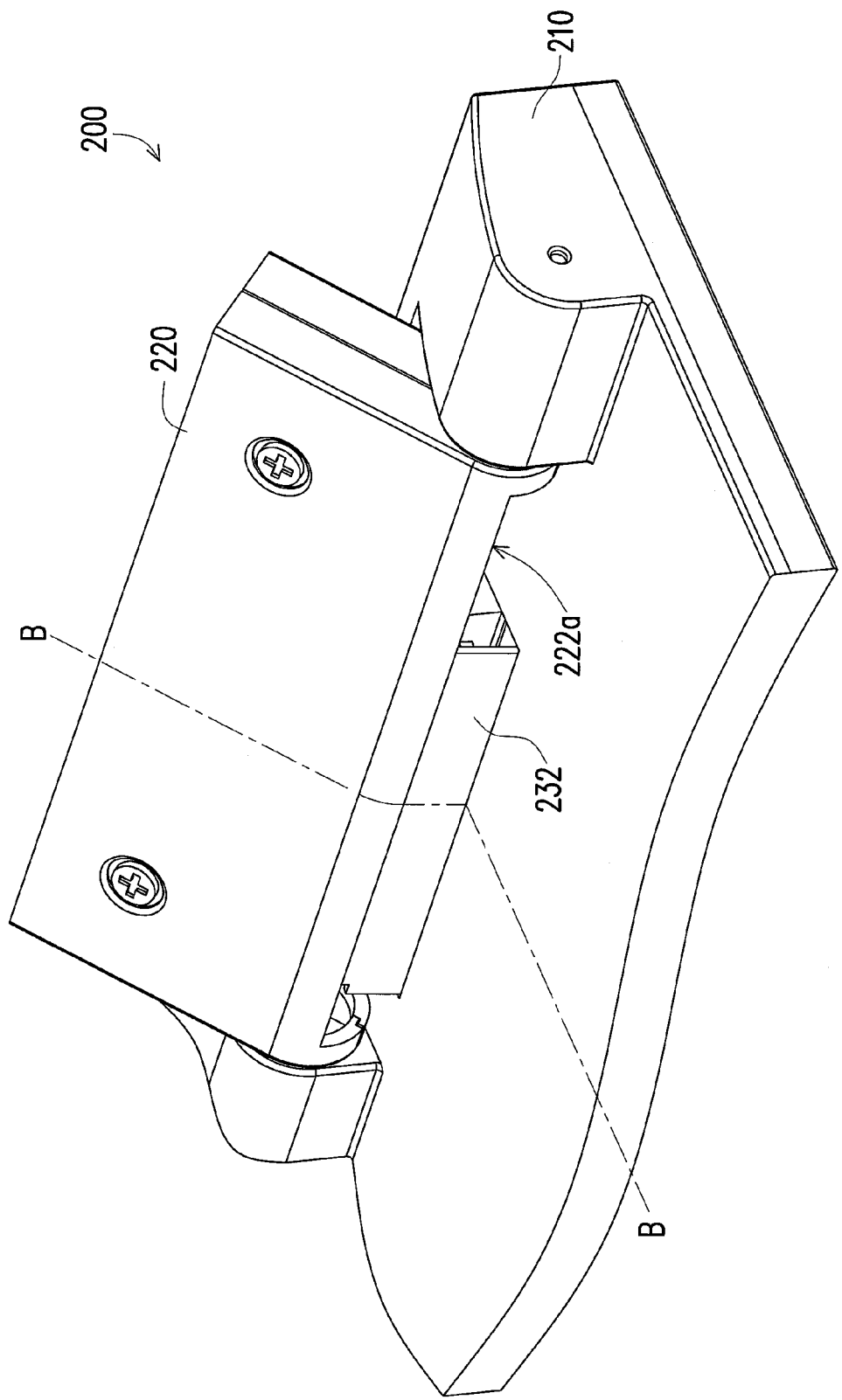
FIG. 5B is a schematic diagram of the expansion apparatus of FIG. 5A.

FIG. 5A is an exploded view of a part of an expansion apparatus according to another embodiment of the invention. FIG. 5B is a schematic diagram of the expansion apparatus of FIG. 5A. Referring to FIG. 5A and FIG. 5B, a difference between the expansion apparatus 200 and the expansion apparatus 100 of FIG. 2 is that in the expansion apparatus 200 of the present embodiment, an airflow guiding structure 230 includes a plurality of diversion covers 232 (two diversion covers are illustrated), and the diversion covers 232 are pivoted to a base 210, and each of the diversion covers 232 is capable of rotating relative to the base 210.

Figure 6A:
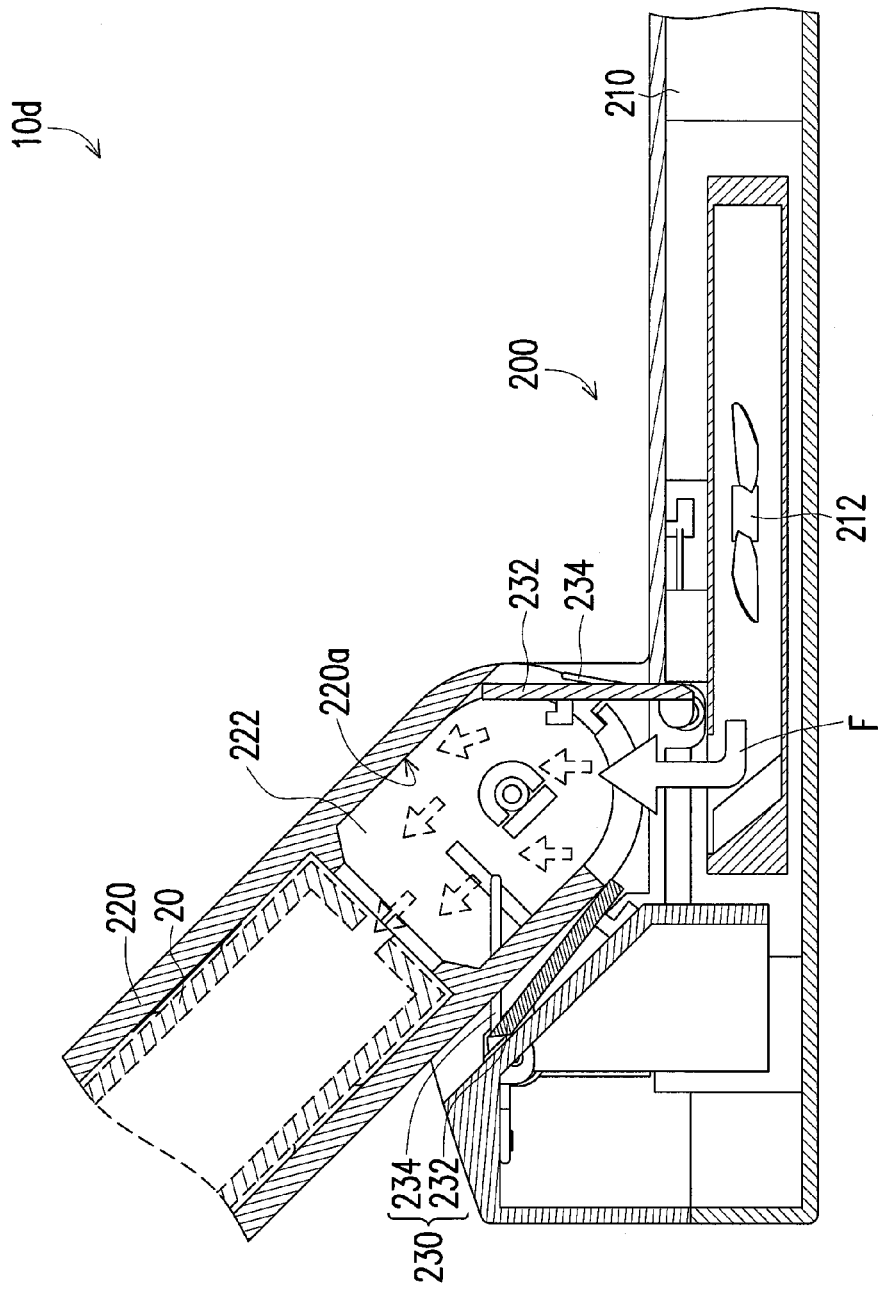
FIG. 6A is a cross-sectional view of the expansion apparatus of FIG. 5B along a line B-B.
Figure 6B:
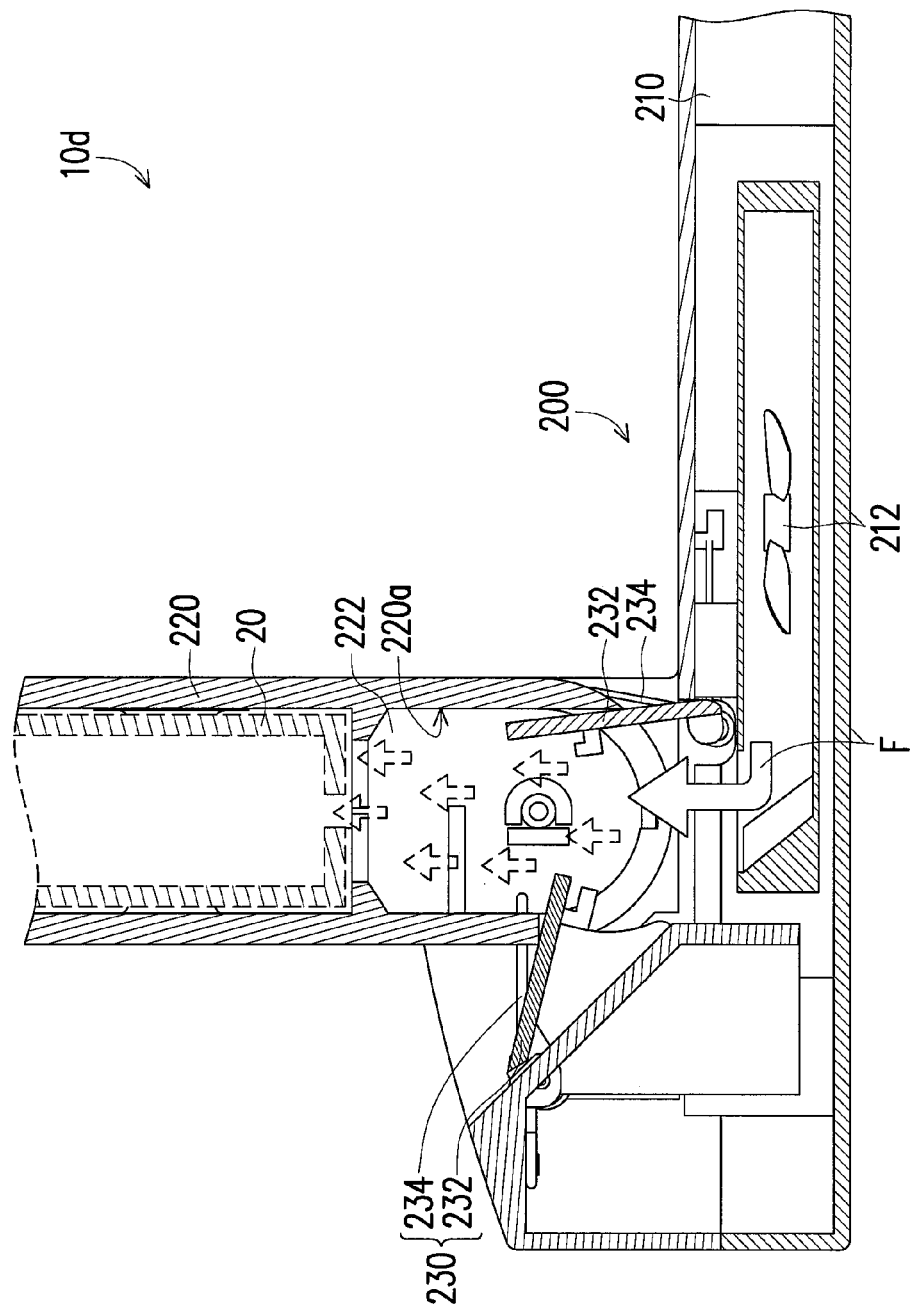
FIG. 6B and FIG. 6C are respectively schematic diagrams of a supporter expanded relative to a base in another angle and closed to the base.
Figure 6C:
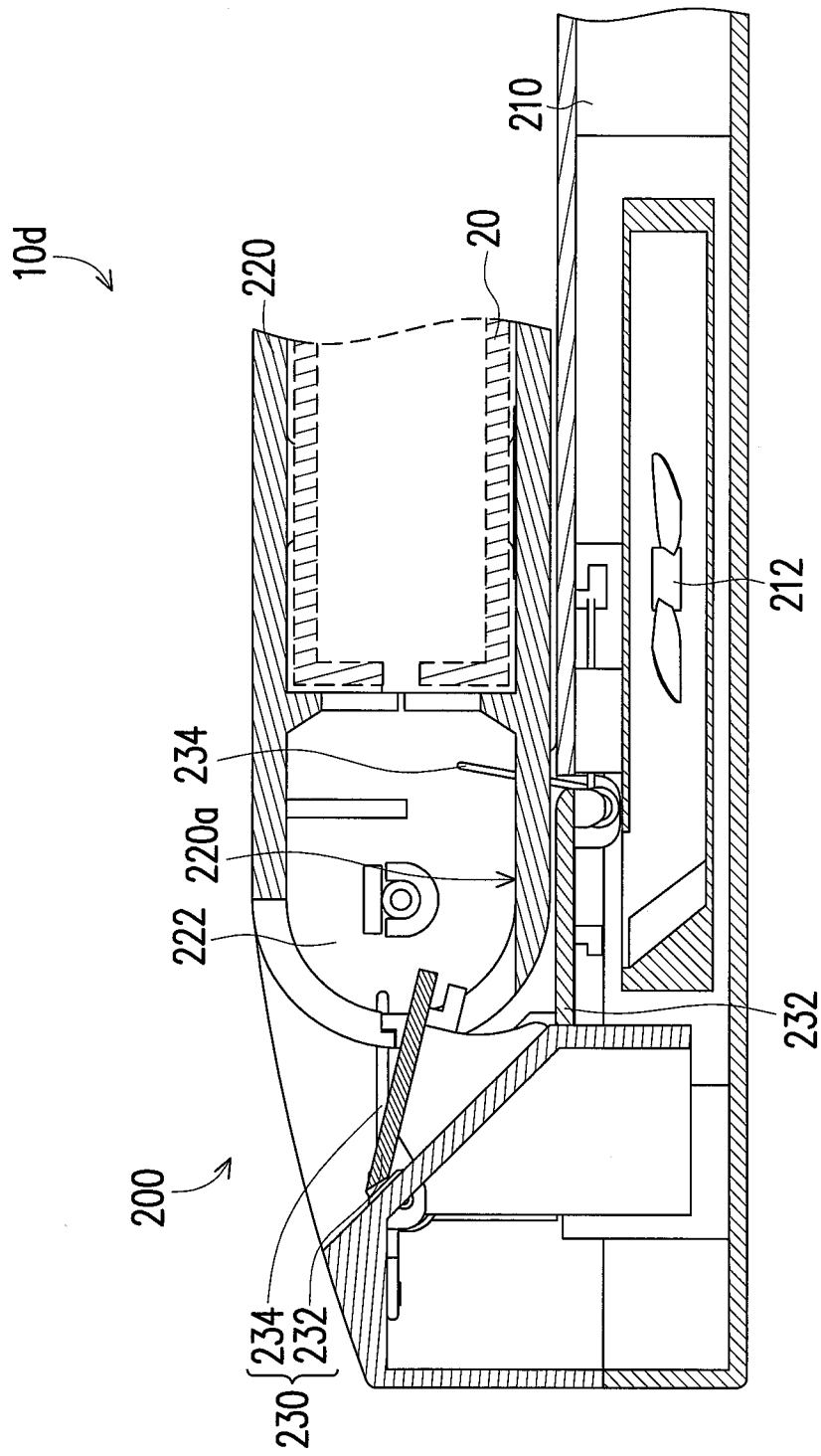

FIG. 6A is a cross-sectional view of the expansion apparatus of FIG. 5B along a line B-B. FIG. 6B and FIG. 6C are respectively schematic diagrams of the supporter expanded relative to the base in another angle and closed to the base. Referring to FIG. 6A to FIG. 6C, when the electronic apparatus 20 is assembled to the expansion apparatus 200 to form electronic equipment 10d, a plurality of gaps exist between a cooling channel 222 and the base 210 in a state as that shown in FIG. 6C. When the supporter 220 is pivoted relative to the base 210 to the expanded state (shown in FIG. 6A and FIG. 6B), the supporter 220 leans against the diversion covers 232 and drives the diversion covers 232 to rotate relative to the supporter 220, so as to narrow or cover the gaps between a first port 222a of the cooling channel 222 and the base 210. In other words, a relative position of the diversion cover 232 in the supporter 220 is, for example, an angle of the diversion cover 232 relative to the supporter 220, which is varied along with a pivoting angle of the supporter 220 relative to the base 210. The expansion apparatus 200 of the present embodiment can also guide the active airflow F generated by the first fan 212, where the active airflow F is guided by the diversion covers 232 to flow through the cooling channel 222, and is output to the electronic apparatus 20.

Moreover, in the present embodiment, the airflow guiding structure 230 further includes a plurality of elastic member 234 (two elastic members are illustrated). The elastic members 234 are correspondingly assembled between the diversion covers 232 and the base 210. When the supporter 220 is pivoted relative to the base 210 to the expanded state, the elastic members 234 can correspondingly drive the diversion covers 232 to continually lean against the supporter 220. Therefore, in the present embodiment, the diversion covers 232 can continually lean against the supporter 220 through elastic potential energy released by the elastic members 234. In detail, during a process that the supporter 220 is pivoted relative to the base 210 to the expanded state, the supporter 220 continually leans against the diversion covers 232, and pushes the diversion covers 232 to rotate relative to the base 210 to a state as that shown in FIG. 6A or FIG. 6B, such that the elastic members 234 can store elastic potential energy. When the supporter 220 stops rotating and is fixed to the expanded state, the elastic potential energy released by the elastic members 234 can be continually imposed on the diversion covers 232 to drive the diversion covers 232 to continually lean against the supporter 220. In the present embodiment, the elastic member 234 is, for example, a torsion spring, though the invention is not limited thereto.

In summary, in the expansion apparatus of the invention, the base has the first fan to generate the active airflow. The supporter has the cooling channel therein, and the airflow guiding structure is located in the cooling channel. The airflow guiding structure is, for example, a diversion gate having a diversion channel or a diversion cover pivoted to the base. The active airflow generated by the first fan is guided by the airflow guiding structure to flow through the cooling channel and is output to or exhausted from the electronic apparatus, so as to improve the cooling efficiency of the electronic apparatus. Moreover, when the airflow guiding structure is the diversion gate, the diversion gate can be rotated within the cooling channel relative to the supporter, so as to maintain the diversion channel to continually face to the first fan. Moreover, when the airflow guiding structure is the diversion cover, the elastic member can be used to drive the diversion cover to continually lean against the supporter, so as to prevent the active airflow generated by the first fan from leaking through the gap between the supporter and the base.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An expansion apparatus, adapted to an electronic apparatus, the expansion apparatus comprising:
   a base, having a first fan;
   a supporter, pivoted to the base along a rotating axis, and having a cooling channel, wherein the cooling channel has a first port adjacent to the base and a second port opposite to the first port, and when the electronic apparatus is assembled to the supporter, the second port of the cooling channel faces to the electronic apparatus; and an airflow guiding structure, movably disposed between the supporter and the base, wherein when the supporter is pivoted relative to the base to an expanded state, an active airflow generated by the first fan is guided by the airflow guiding structure to flow through the base and the electronic apparatus.

2. The expansion apparatus as claimed in claim 1, wherein the active airflow generated by the first fan is guided to the first port of the cooling channel by the airflow guiding structure, and is output to the electronic apparatus through the second port of the cooling channel.

3. The expansion apparatus as claimed in claim 1, wherein the active airflow generated by the first fan flows from the second port of the cooling channel to the first port of the cooling channel and away from the electronic apparatus via the airflow guiding structure.

4. The expansion apparatus as claimed in claim 1, wherein a relative position between the airflow guiding structure and the supporter is varied as the supporter is pivoted relative to the base.

5. The expansion apparatus as claimed in claim 4, wherein the relative position is an angle of the supporter relative to the airflow guiding structure.

6. The expansion apparatus as claimed in claim 1, wherein the airflow guiding structure comprises:

a diversion gate, disposed in the cooling channel and pivoted to the supporter, wherein the diversion gate has at least one diversion channel, and when the supporter is pivoted relative to the base to the expanded state, the diversion channel corresponds to the first fan.

7. The expansion apparatus as claimed in claim 6, wherein when the supporter is pivoted relative to the base to the expanded state, the diversion gate is rotated relative to the supporter through gravity, so as to maintain the diversion channel to face to the first fan.

8. The expansion apparatus as claimed in claim 1, wherein the cooling channel has at least one sidewall, and the sidewall comprises a curved surface, wherein a center of curvature of the curved surface is substantially overlapped to the rotating axis, and when the supporter is pivoted relative to the base to the expanded state, the airflow guiding structure continually leans against the curved surface.

9. The expansion apparatus as claimed in claim 1, wherein the airflow guiding structure comprises:

a plurality of diversion covers, pivoted to the base, and each of the diversion covers being capable of rotating relative to the base.

10. The expansion apparatus as claimed in claim 9, wherein when the supporter is pivoted relative to the base to the expanded state, the supporter leans against the diversion covers, and drives the diversion covers to rotate relative to the supporter, so as to narrow or cover a gap between the first port of the cooling channel and the base.

11. The expansion apparatus as claimed in claim 10, wherein the airflow guiding structure further comprises:

a plurality of elastic members, correspondingly assembled between the diversion covers and the base, wherein when the supporter is pivoted relative to the base to the expanded state, the elastic members correspondingly drive the diversion covers to continually lean against the supporter.

12. An electronic equipment, comprising:
an electronic apparatus; and an expansion apparatus, wherein the electronic apparatus is adapted to be disposed in the expansion apparatus, and the expansion apparatus comprises:

a base, having a first fan;

a supporter, pivoted to the base along a rotating axis, and having a cooling channel, wherein the cooling channel has a first port adjacent to the base and a second port opposite to the first port, and when the electronic apparatus is assembled to the supporter, the second port of the cooling channel faces to the electronic apparatus; and an airflow guiding structure, movably disposed between the supporter and the base, wherein when the supporter is pivoted relative to the base to an expanded state, an active airflow generated by the first fan is guided by the airflow guiding structure to flow through the base and the electronic apparatus.

13. The electronic equipment as claimed in claim 12, wherein the electronic apparatus has a third port, when the electronic apparatus is assembled to the supporter, the third port faces to the second port, and the active airflow generated by the first fan is guided to the first port of the cooling channel by the airflow guiding structure, and is output through the second port of the cooling channel, and reaches the electronic apparatus through the third port.

14. The electronic equipment as claimed in claim 13, wherein the electronic apparatus further has a fourth port, and after the active airflow generated by the first fan enters the electronic apparatus, the active airflow is exhausted to leave the electronic apparatus through the fourth port.

15. The electronic equipment as claimed in claim 12, wherein the electronic apparatus has a third port, when the electronic apparatus is assembled to the supporter, the third port faces to the second port, and the active airflow generated by the first fan flows from the third port to the second port of the cooling channel, and then flows through the first port of the cooling channel and leaves the electronic apparatus via the airflow guiding structure.

16. The electronic equipment as claimed in claim 12, wherein the electronic apparatus has a third port and comprises a second fan, when the electronic apparatus is assembled to the supporter, the third port faces to the second port, and an active airflow generated by the second fan flows from the third port to the second port of the cooling channel, and then flows through the first port of the cooling channel and leaves the electronic apparatus via the airflow guiding structure.

17. The electronic equipment as claimed in claim 12, wherein a relative position between the airflow guiding structure and the supporter is varied as the supporter is pivoted relative to the base.

18. The electronic equipment as claimed in claim 17, wherein the relative position is an angle of the supporter relative to the airflow guiding structure.

19. An electronic apparatus, adapted to be disposed in an expansion apparatus having a movable airflow guiding structure, wherein the expansion apparatus has a cooling channel, the cooling channel has a first port and a second port opposite to the first port, and the second port of the cooling channel faces to the electronic apparatus, the electronic apparatus comprising:

a casing, having a third port; and a cover element, disposed on the casing to cover the third port, wherein when the electronic apparatus is disposed on the expansion apparatus, the cover element is displaced due to a force, and the third port is communicated with the second port.

20. The electronic apparatus as claimed in claim 19, wherein the cover element is pushed by a pushing structure of the expansion apparatus to release covering of the third port, and an airflow flows through the expansion apparatus and the electronic apparatus through the third port and the second port.

* * * * *